(12) United States Patent
Sandhu

(10) Patent No.: US 7,687,841 B2
(45) Date of Patent: Mar. 30, 2010

(54) SCALABLE HIGH PERFORMANCE CARBON NANOTUBE FIELD EFFECT TRANSISTOR

(75) Inventor: Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 603 days.

(21) Appl. No.: 11/195,433

(22) Filed: Aug. 2, 2005

(65) Prior Publication Data

US 2007/0029612 A1   Feb. 8, 2007

(51) Int. Cl.
   *H01L 27/108* (2006.01)
(52) U.S. Cl. .................. 257/296; 257/E51.04; 977/742
(58) Field of Classification Search ................. 438/517, 438/99, 301, 303, 413; 977/734, 742, 842, 977/938; 257/288, 296, E51.04
   See application file for complete search history.

(56) References Cited

U.S. PATENT DOCUMENTS

| | | | | |
|---|---|---|---|---|
| 6,423,583 | B1* | 7/2002 | Avouris et al. | 438/132 |
| 6,472,685 | B2* | 10/2002 | Takagi | 257/77 |
| 7,083,104 | B1* | 8/2006 | Empedocles et al. | 235/491 |
| 7,115,916 | B2* | 10/2006 | Avouris et al. | 257/103 |
| 7,132,714 | B2* | 11/2006 | Bae et al. | 257/329 |
| 7,161,218 | B2* | 1/2007 | Bertin et al. | 257/415 |
| 7,381,983 | B2* | 6/2008 | Bae et al. | 257/40 |
| 2003/0098488 | A1* | 5/2003 | O'Keeffe et al. | 257/401 |
| 2003/0170930 | A1* | 9/2003 | Choi et al. | 438/99 |
| 2007/0132043 | A1* | 6/2007 | Bradley et al. | 257/414 |
| 2008/0026534 | A1* | 1/2008 | Avouris et al. | 438/301 |
| 2008/0121996 | A1* | 5/2008 | Park et al. | 257/365 |

OTHER PUBLICATIONS

I. Radu et al., "Oriented Growth of Single-Wall Carbon Nanotubes Using Alumina Patterns," Nanotechnology, vol. 15, pp. 473-476 (Feb. 2, 2004).
S. Li et al., "Silicon Nitride Gate Dielectric for Top-Gated Carbon Nanotube Field Effect Transistors," J. Vac. Sci. Technol. B, vol. 22, No. 6, pp. 3112-3114 (Dec. 10, 2004).
A. Yu, "A Study of Carbon Nanotubes and Their Applications in Transistors," School of Electrical and Computer Engineering, 1-32 (May 17, 2004) (published at http://132.236.67.210/engrc350/ingenuity/Yu_A_paper_issue_3.pdf).

(Continued)

*Primary Examiner*—Khiem D Nguyen
(74) *Attorney, Agent, or Firm*—Wong, Cabello, Lutsch, Rutherford & Brucculeri, LLP

(57) ABSTRACT

A structure and fabrication process for a carbon nanotube field effect transistor is disclosed herein. The structure employs an asymmetric gate which is closer to the source and farther from the drain, which helps to minimize "off current" drain leakage when the drain is biased and the gate is otherwise off. In an embodiment, the source and drain are preferably self aligned to the gate, and preferably the gate is first defined as a conductive sidewall to an etched pad. Dielectric sidewalls are then defined over the gate, which in turn defines the positioning of the source and drain in a predetermined spatial relationship to the gate. In a preferred embodiment, the source and drain comprise conductive sidewalls buttressing the dielectric sidewalls. The channel of the device preferably comprises randomly oriented carbon nanotubes formed on an insulative substrate and isolated from the gate by an insulative layer. In a preferred embodiment, the carbon nanotubes are exposed via the dielectric sidewall etch, thus ensuring the gate's self alignment with the subsequently-formed source and drain.

24 Claims, 4 Drawing Sheets

OTHER PUBLICATIONS

"Carbon Nanotubes and Nanotube Transistors," ECE497NC Lecture 14, 1-9 (Mar. 10, 2004) (published at http://www.crhc.uiuc.edu/ece497nc/scribe/nanotubel.pdf).

A. Javey et al., "Carbon Nanotube Field-Effect Transistors with Integrated Ohmic Contacts and High-K Gate Dielectrics," Nano Letters, vol. 4, No. 3, pp. 447-450 (Feb. 20, 2004).

S. Heinze et al., "Electrostatic Engineering of Nanotube Transistors for Improved Performance," Applied Physics Letters, vol. 83, No. 24, pp. 5038-5040 (Dec. 15, 2003).

A. Javey, et al., "Advancements in Complementary Carbon Nanotube Field-Effect Transistors," IEDM Tech. Digest., pp. 741-774 (2003).

J. Guo, et al., "Performance Projections for Ballistic Carbon Nanotube Field-Effect Transistors," Applied Physics Letters, vol. 80, No. 17, pp. 3192-3194 (Apr. 29, 2002).

X. Liu, et al., "Carbon Nanotube Field-Effect Inverters," Applied Physics Letters, vol. 79, No. 20, pp. 3329-3331 (Nov. 12, 2001).

R. Martel, et al., "Single- and Multi-Wall Carbon Nanotube Field-Effect Transistors," Applied Physics Letters, vol. 73, No. 17, pp. 2447-2449 (Oct. 26, 1998).

Jae-Hong Park et al., "Screen Printed Carbon Nanotube Field Emitter Array for Lighting Source Application," Technical Digest of the 17th International Vacuum Nanoelectronics Conference 2004, pp. 142-143 (Jul. 11-16, 2004).

B.J.C. Thomas et al, "Multi-Walled Carbon Nanotube Coatings Using Electrophoretic Deposition (EPD)," J. Am. Ceramic Soc'y, vol. 88(4), p. 980 (Apr. 2005).

* cited by examiner

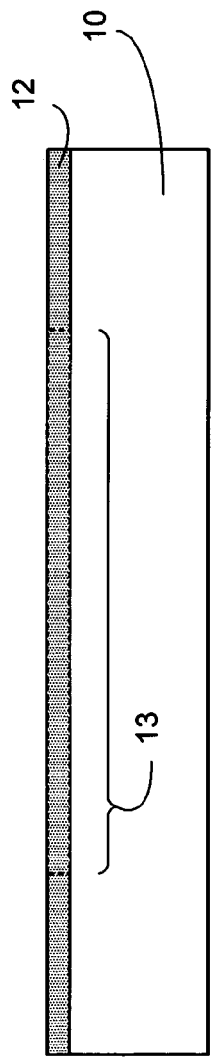
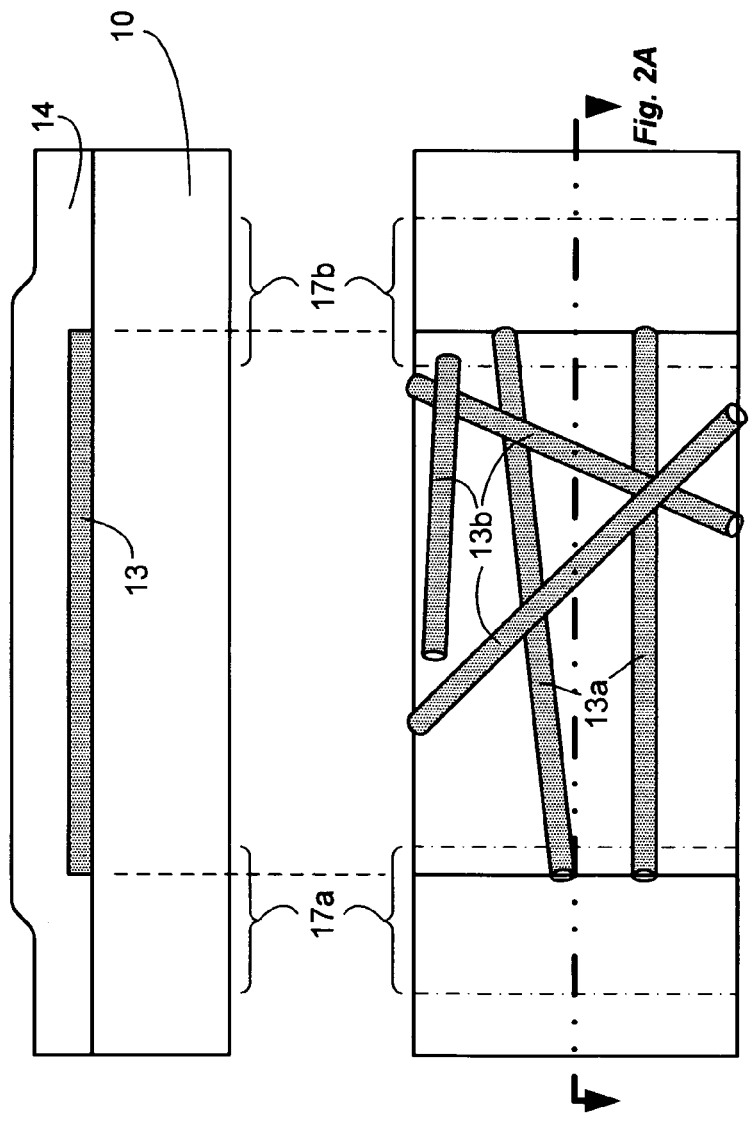
Figure 1
Figure 2A
Figure 2B

SCALABLE HIGH PERFORMANCE CARBON NANOTUBE FIELD EFFECT TRANSISTOR

FIELD OF THE INVENTION

Embodiments of this invention relate to transistors, and specifically to field effect transistors using carbon nanotubes as the conduction media between the source and the drain.

BACKGROUND

High performance Carbon Nanotube (CNT) Field Effect Transistors (FETs) have been demonstrated in the art. See, for example, the following references, which are all incorporated herein by reference: I. Radu et al., "Oriented Growth of Single-Wall Carbon Nanotubes Using Alumina Patterns," Nanotechnology, Vol. 15, pp. 473-476 (Feb. 2, 2004); S. Li et al., "Silicon Nitride Gate Dielectric for Top-Gated Carbon Nanotube Field Effect Transistors," J. Vac. Sci. Technol. B, Vol. 22, No. 6, pp. 3112-3114 (Dec. 10, 2004); A. Yu, "A Study of Carbon Nanotubes and Their Applications in Transistors," School of Electrical and Computer Engineering, 1-32 (May 17, 2004) (published at http://132.236.67.210/engrc350/ingenuity/Yu_A_paper_issue_3.pdf); "Carbon Nanotubes and Nanotube Transistors," ECE497NC Lecture 14, 1-9 (Mar. 10, 2004) (published at http://ww-w.crhc.uiuc.edu/ece497nc/scribe/nanotube1.pdf); A. Javey et al., "Carbon Nanotube Field-Effect Transistors with Integrated Ohmic Contacts and High-K Gate Dielectrics," Nano Letters, Vol. 4, No. 3, pp. 447-450 (Feb. 20, 2004); S. Heinze et al., "Electrostatic Engineering of Nanotube Transistors for Improved Performance," Applied Physics Letters, Vol. 83, No. 24, pp. 5038-5040 (Dec. 15, 2003); A. Javey et al., "Advancements in Complementary Carbon Nanotube Field-Effect Transistors," IEDM Tech. Digest., pp. 741-74 (2003); J. Guo et al., "Performance Projections for Ballistic Carbon Nanotube Field-Effect Transistors," Applied Physics Letters, Vol. 80, No. 17, pp. 3192-3194 (Apr. 29, 2002); X. Liu et al., "Carbon Nanotube Field-Effect Inverters," Applied Physics Letters, Vol. 79, No. 20, pp. 3329-3331 (Nov. 12, 2001); R. Martel et al., "Single- and Multi-Wall Carbon Nanotube Field-Effect Transistors," Applied Physics Letters, Vol. 73, No. 17, pp. 2447-2449 (Oct. 26, 1998).

As these prior approaches make clear, a CNT FET, like a traditional FET, comprises a gate, a source, and a drain. A carbon nanotube, or a plurality of carbon nanotubes, span(s) lengthwise between the source and the drain such that an end of each tube(s) is in contact with the drain and source. Accordingly, the carbon nanotube(s) comprise(s) the conductive media or "channel" for the CNT FET.

One problem with this design of CNT FETs is control of the "off current" of such devices. Specifically, a CNT FET should ideally draw no or negligible current between the source and the drain when the device is off, i.e., when no potential is applied to the gate and despite the presence of a typical voltage on the drain of the device. However, such ideal performance is difficult to achieve due to modulation of the barrier heights at the CNT/source-drain interface. In short, CNT FETs tend to leak drain current when a voltage is applied to the drain, but no voltage is applied to the gate.

One proposed solution to this problem in CNT FETs has been to use a gate which is asymmetric with respect to the drain and the source. More specifically, it has been proposed to move the gate away from the drain and towards the source to minimize barrier height modulation at the drain. For example, such an approach was postulated in S. Heinze et al., "Electrostatic Engineering of Nanotube Transistors for Improved Performance," Applied Physics Letters, Vol. 83, No. 24, pp. 5038-5040 (Dec. 15, 2003), which was incorporated by reference above. However, a review of this reference shows that the asymmetric devices there illustrated are hypothetical in nature. In short, while useful to illustrate the problem of symmetric gates, and the possible solution of asymmetric gates, this reference does little to illustrate how such a device can be fabricated in any sensible, practical, or cost-effective way.

If the benefits of asymmetric gates in CNT FETs are to be realized, efficient manufacturing methods will need to be developed. This is non-trivial, especially when the importance of self aligned processes are understood. Generally, to promote uniformity in the performance of transistors, self aligned techniques are used to ensure that the source and drain will be automatically aligned with the gate. In a simple example, a self aligned process in the fabrication of a transistor might comprise patterning the transistor gate and then using that gate as a mask for the source/drain ion implants. By use of a self aligned process, it can be assured that all of the transistors fabricated will roughly operate in the same fashion. Consider by contrast a non-self aligned transistor fabrication process in which source and drains are fabricated first, followed by patterning of the gate. Due to process variations and inconsistencies in the alignment of the gate from transistor to transistor, one could not expect the drain-to-source current to be very uniform from transistor to transistor. Additionally, use of such a non-self aligned process makes a particular transistor fabrication process difficult to scale to smaller geometries.

In short, what is needed in the CNT FET art is a transistor fabrication process that: allows for the provision of an asymmetric gate; is efficient and cost effective; preferably uses standard fabrication procedures; is self aligned; and is scalable. This disclosure presents embodiments of such a solution.

SUMMARY

A structure and fabrication process for a carbon nanotube field effect transistor is disclosed herein. The structure employs an asymmetric gate which is closer to the source and farther from the drain, which helps to minimize "off current" drain leakage when the drain is biased and the gate is otherwise off. In a preferred embodiment, the source and drain are preferably self aligned to the gate. Specifically, the gate is defined first, preferably as a conductive sidewall to an etched pad. Dielectric sidewalls are then defined over the gate, which in turn defines the positioning of the source and drain in predetermined spatial relationship to the gate. In a preferred embodiment, the source and drain comprise conductive sidewalls buttressing the dielectric sidewalls. The channel of the device preferably comprises randomly oriented carbon nanotubes formed on an insulative substrate and isolated from the gate by an insulative layer. In a preferred embodiment, the carbon nanotubes are exposed via the dielectric sidewall etch, thus ensuring the gate's self alignment with the subsequently-formed source and drain. Some of the randomly-oriented carbon nanotubes will have their ends in contact with the source and drain, and hence will be modulatable in their conductivity so as to usefully contribute to the performance of the transistor. In other preferred embodiments, single nanotubes can be formed between the source and drain. Single-walled nanotubes, multi-walled nanotubes, or both may be used in useful embodiments of the disclosed transistor structure.

BRIEF DESCRIPTION OF THE DRAWINGS

Embodiments of the inventive aspects of this disclosure will be best understood with reference to the following detailed description, when read in conjunction with the accompanying drawings, in which:

FIGS. 1 through 9 illustrate sequential steps in the fabrication of a self aligned, asymmetric gate CNT FET.

DETAILED DESCRIPTION

Figure 3:
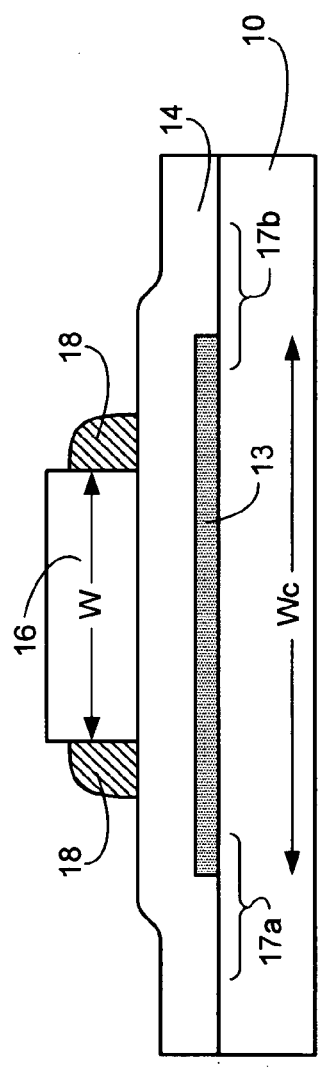

As alluded to above, disclose herein is the structure and manufacturing process for a asymmetric CNT FET in which the gate is closer to the source than to the drain. Through this structure, off leakage currents are reduced and transistor performance is improved. Moreover, the disclosed manufacturing technique relies upon the use of largely standard semiconductor processing techniques, and provides a source and drain that are self aligned to the gate.

An embodiment of the manufacturing process starts with reference to the cross sectional view of FIG. 1. Shown is substrate 10 as coated with a CNT layer 12. In a preferred embodiment, the substrate 10 is insulative, and can comprise a silicon dioxide ("oxide") for example. Such an oxide substrate 10 can comprise an oxide deposited on a silicon substrate, the insulative layer of a silicon-on-insulator (SOI) wafer, a solid insulative substrate such as a sapphire substrate, etc. Other insulative materials could be used for substrate 10 as well, e.g., silicon nitride ("nitride").

The CNT layer 12 in a preferred embodiment is placed on the substrate 10 using a spin on process. See, e.g., Jae-Hong Park et al., "Screen Printed Carbon Nanotube Field Emitter Array for Lighting Source Application," Technical Digest of the 17th International Vacuum Nanoelectronics Conference 2004, pp. 142-143 (Jul. 11-16, 2004), which is incorporated herein by reference. The thickness of this coating is preferably substantially less than the length of the carbon nanotubes such that when the solvent is spun on the substrate, the carbon nanotubes will tend to lay flat, i.e., with their axes substantially parallel to the plane of the substrate 10. Then, the coating is baked to remove the solvent, leaving the carbon nanotubes in a random yet flat arrangement, as shown in FIG. 2B, which will be discussed subsequently. Of course, other methods could be used to form the CNT layer 12 as well, such as CVD plasmas, electrophoretic deposition, etc. See, e.g., B. J. C. Thomas et al, "Multi-Walled Carbon Nanotube Coatings Using Electrophoretic Deposition (EPD)," J. Am. Ceramic Soc'y, Vol. 88(4), pg. 980 (April 2005), which is incorporated herein by reference. Ultimately the method used to deposit the CNT layer 12 is not critically important to the transistor design disclosed herein.

Once the CNT layer 12 is formed, that layer is masked and etched to form the channel region 13 of the transistor, as shown in FIG. 2A. Again, the specific details of masking and etching the CNT layer 12 are not critically important to the transistor design disclosed herein, and could be achieved in numerous ways. For example, an oxide hard mask could be defined and patterned over the CNT layer 12 (not shown), and then the resulting structure subject to a dry etch in an $O_2$-containing plasma to remove unwanted portions of the CNT layer 12 outside of the desired channel regions 13.

Before discussing subsequent steps in the CNT FET fabrication process, it is useful to describe the CNT channel region 13, which is shown in a top view in FIG. 2B. As noted earlier, the deposition of the CNT layer 12 causes the carbon nanotubes to lie generally parallel to the plane of the substrate 10, but otherwise with a random orientation. This is easily seen in FIG. 2B, and specifically two groups of carbon nanotubes 13a, 13b are shown, with each appropriately labeled in accordance with their relationship to a source region 17a and a drain region 17b. The source and drain regions 17a, 17b are not yet formed in FIG. 2B, and thus these regions should be understood as indicative of the future positioning of those regions when later formed. What can be seen is that, due to the randomness of the orientation of the carbon nanotubes 13a, 13b, one subset of tubes (13a) will be in a proper orientation with respect to the source and drain regions 17a, 17b. Specifically, those tubes 13a will have ends terminating in both of the regions 17a, 17b such that they can act as modulatable channel conductors. The other subset of nanotubes 13b have at least one end that does not terminate in either the source or drain regions 17a or 17b. As a result, these nanotubes 13b cannot comprise channel conductors. In any event, because some percentage of the nanotubes 13a will contribute to channel conduction in each transistor, the various transistors formed should be of acceptable uniformity and relatively equal in terms of source-to-drain current performance, despite the randomness of the orientation of the nanotubes.

Returning again to FIG. 2A, after CNT channel region 13 formation, an insulative layer 14 is formed thereover. In a preferred embodiment, insulative layer 14 comprises an oxide, but could comprise other dielectric materials as well. As will be seen, insulative layer 14 comprises the gate oxide of the CNT FET to be formed.

Next, and as shown in FIG. 3, a pad 16 is formed generally over the CNT channel region 13. Pad 16 is preferably formed of a dielectric material such as nitride, but could be formed of other materials as well. Although not shown, pad 16 is defined by commonplace means (photolithography and etch), and in a preferred embodiment comprises a linewidth W of a minimum lithography resolution, although it could be made larger. It is important to align the mask for pad 16 so as to come within the confines of the CNT channel region 13 defined earlier. However, this would preferably not be considered a critical alignment step, because the width of the CNT channel region 13, Wc, can be made significantly larger than the width W of the pad 16. As a result, processing and transistor fabrication will yield a normal device even should the pad 16 be misaligned within the CNT channel region 13 to a permissible tolerance.

After pad 16 definition, a gate material 18 for the CNT FET is deposited as shown in FIG. 3. As shown, the gate material 18 is formed on the sidewalls of the pad 16 via standard deposition and anisotropic etchback procedures. In a preferred embodiment, the gate material 18 comprises a conductive material, such as a metal, silicide, or a polysilicon.

Figure 4:
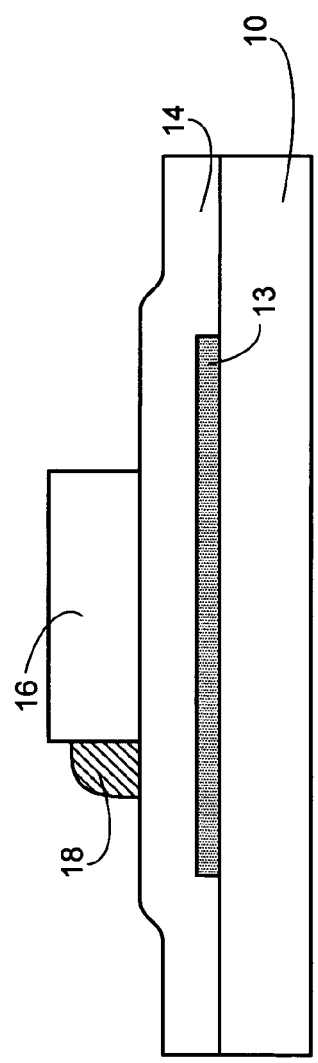

As noted earlier, one of the goals of the disclosed transistor design is to provide a gate which is asymmetric with respect to the source and drain regions 17a, 17b. As a result, only one of the gates 18 formed on the sidewall of the pad 16 in FIG. 3 will be active, and as a result the other of the gates 18 can be removed, as shown in FIG. 4. Such removal of one of the gates 18 is easily achievable via the use of an additional photolithography mask (not shown). Such mask would not require an alignment any more critical than the one used to define the position of the pad 16 over the CNT channel region 13; in other words, the use of an optional mask to remove one of the gates 18 does not require a technically sensitive alignment step. Alternatively, the unused gate 18 need not be removed but could remain on the device without being biased in any way useful to transistor operation. For example, the unused gate could be left unconnected to any gate potential, could be grounded, etc. Or, the unused gate could be separately biased to perform any other device function (e.g., reversed biased), etc.

Figure 5:
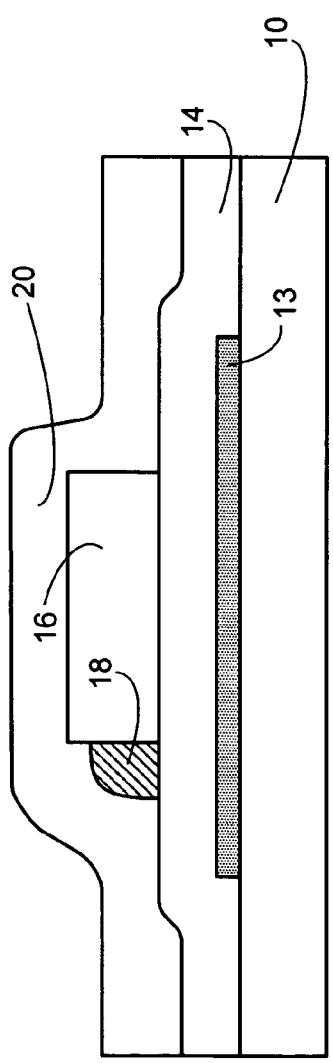
Figure 6:
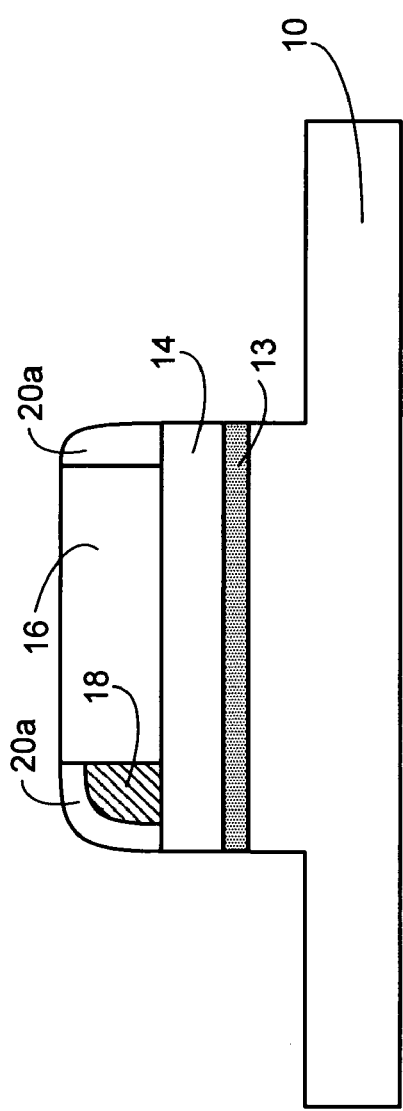
Figure 7:
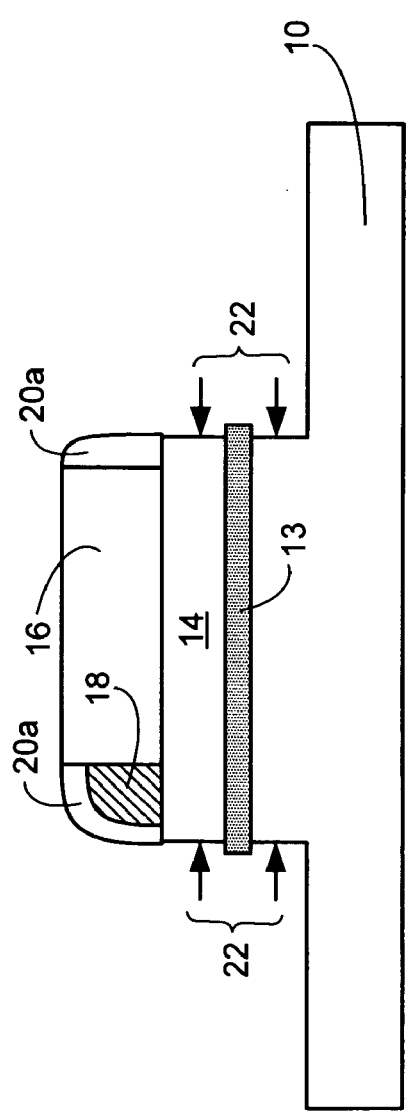

Next, and as shown in FIG. 5, another dielectric layer 20 is formed over the resulting structure. In a preferred embodiment, dielectric layer 20 comprises a nitride, but could comprise other materials as well. Thereafter, and as shown in FIG. 6, the resulting structure is subject to an anisotropic etchback process to form sidewalls 20a out of the dielectric layer 20. In a preferred embodiment, this anisotropic etch continues (or new etchant are used) even after formation of the sidewalls 20a to etch into insulative layer 14, CNT channel region 13, and the substrate 10 as shown. In so doing, the edges of the CNT channel region 13 (and the ends of the carbon nanotubes therein) are exposed. Although the transition from FIG. 5 to FIG. 6 is shown as one etching step, one skilled in the art will understand that several different etches may be employed in this transition.

As will be seen, the CNT channel region 13 will subsequently be brought into contact with conductive materials that form the source and drain of the transistor. In anticipation of this and to improve electrical contact between the CNT channel region 13 and the source and drain, the dielectric layers 14, 10 are preferably recessed 22 to better expose the edges of the CNT channel region 13. Such recessing can be achieved via any number of known plasma or wet isotropic etches.

Figure 8:
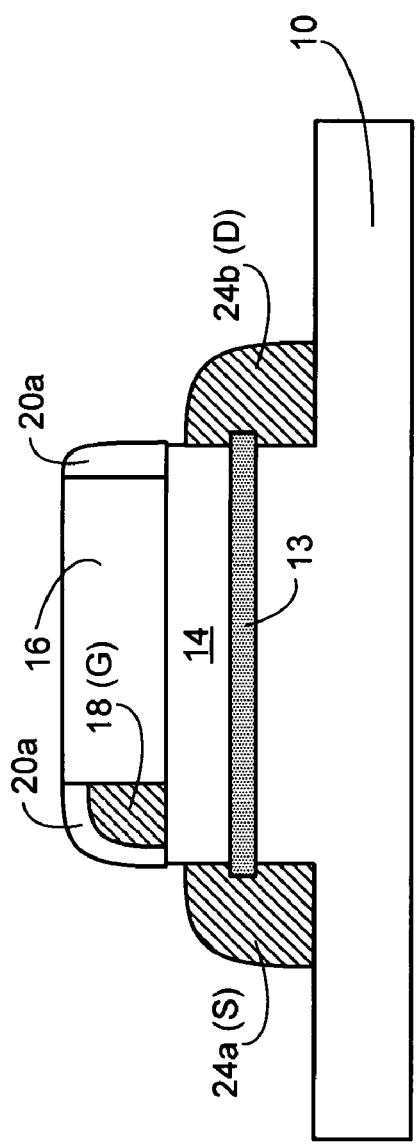

Next, and referring to FIG. 8, the conductive material 24 is deposited for the source and drain regions 24a, 24b. As shown, the conductive material 24 has been etched back to form a source region 24a and a drain region 24b that comprise sidewalls. However, this should be understood as merely exemplary, as the source and drain regions 24a, 24b could be formed and patterned using more traditional means. Regardless of how the source and drain regions 24a, 24b are formed, notice in FIG. 8 that each is in contact with the exposed edges of the CNT channel region 13. This ensures good electrical contact with the edges of the CNT channel region 13 (and ultimately the edges of some of the carbon nanotubes formed within that region; see FIG. 2B). Moreover, notice that the source and drain regions 24a, 24b are self aligned with respect to the asymmetric gate 18. Stated another way, the spatial relationships between the source 24a, drain 24b, and the gate 18 are set without the need for a special photolithography masking or patterning step to set the alignment between these regions. Instead, the alignment occurs naturally, due in the illustrated embodiment to the use of the sidewalls 20a.

Figure 9:
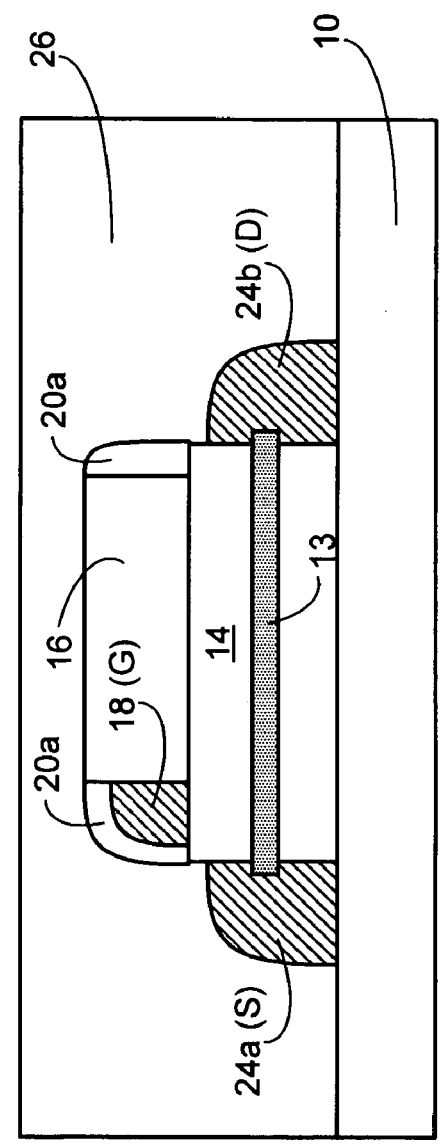

Once the source 24a and drain 24b have been formed, the fully formed transistor is now further processed as it would logically be on an integrated circuit. Thus, as shown in FIG. 9, the fully-formed transistor structure is covered with a dielectric layer 26 (e.g., oxide), which is then preferentially planarized in preparation for the etching of contacts to the source 24a, drain 24b, and gate 18 (not shown for simplicity).

The disclosed transistor structure, and method for making the same, has advantages. First, because the gate is positioned closer to the source 24a and father away from the drain 24b, excessive leakage due to high drain voltages in the off state are minimized. Second, the process is cost effective, and employs the use of many steps and materials that are standard in semiconductor processing. Third, the process is self aligned. To reiterate, by forming the gate as a sidewall, and by defining the source and drain 24a, 24b by virtue of the spacing and thicknesses of the pad 16 and the sidewalls 18 and 20a, the drain and source 24a, 24b can be positioned without the need for a separate lithography/alignment/patterning step. Fourth, the process is scalable and can be used to form even smaller transistor structures. For example, and referring briefly to FIG. 3, it was noted that the pad 16 was formed at a minimum lithographic dimension, W. Of course, such a minimum resolution can decrease over time as lithography technologies mature, and the process can take advantage of such decreases in size. Moreover, even if lithographic resolution is incapable of shrinking the width of the pad 16, other processes can be utilized to do so. For example, the pad 16, once formed by lithography, could be made more narrow through the use of an isotropic plasma or wet etch for example to set width W to a desired amount.

As the literature makes clear, CNT FETs can be made with single-walled carbon nanotubes, or with multi-walled nanotubes (i.e., tubes within a tube and/or coiled sheets of carbon), and use of the disclosed techniques are likewise adaptable to the use of both types of nanotubes. Both types of tubes (single- or multi-walled) have different electrical properties, and the use of each can be benefited by the disclosed techniques by simply varying the CNT starting material (e.g., in the spin-on solvent). In fact, mixtures of single- and multi-walled carbon nanotubes could be used to fabricate a single transistor.

Moreover, the technique and transistor design disclosed herein are adaptable to the use of transistors which employ a single carbon nanotube as the conduction medium between the source and the drain. Of course, and as the above-incorporated references make clear, should a single nanotube be used as the conduction medium, the disclosed techniques would need to be logically altered to locate such singular nanotubes at proper locations on the substrate. For example, and referring to FIGS. 2A and 2B, a single carbon nanotube when used with the disclosed technique would need to be predictably known with respect to the pad 16 that would eventually be formed above it. In this regard, those skilled in the art know how to locate and/or grow single nanotubes on a substrate at predictable locations. As a result, such processes are not reiterated herein, but could be used to form single carbon nanotube transistors otherwise befitting from the structure and fabrication processes disclosed herein.

It should be noted that reference to transistor terminals "source" and "drain" are synonymous in the context of an FET. Therefore, the disclosed transistor should be viewed as applicable to transistors in which the gate is also closer to the drain than to the source, as it is essentially random or a matter of preference as to what these terminals may be called in a particular transistor.

While the disclosed design and processing techniques are particularly useful to CNT FETs, which suffer unique problems due to drain leakage, the disclosed design and processing techniques can also be applied to the formation of regular FETs as well, e.g., those that have semiconductive (silicon) channels.

It should be understood that the inventive concepts disclosed herein are capable of many modifications. To the extent such modifications fall within the scope of the appended claims and their equivalents, they are intended to be covered by this patent.

What is claimed is:

1. A transistor, comprising:
   a channel formed of at least one carbon nanotube, wherein the channel is in contact with a source and with a drain of the transistor;
   a dielectric material proximate to the channel; and
   a gate comprising a sidewall on an edge of a pad, wherein the gate is proximate to the dielectric material, wherein the gate is positioned closer to the source than to the drain, and wherein the source and drain are self aligned with respect to the gate and to the pad.

2. The transistor of claim 1, wherein the channel comprises a plurality of carbon nanotubes, wherein ends of the plurality of carbon nanotubes are in contact with the source and the drain.

3. The transistor of claim 1, wherein the at least one carbon nanotube comprises a single-walled carbon nanotube.

4. The transistor of claim 1, wherein the at least one carbon nanotube comprises a multi-walled carbon nanotube.

5. The transistor of claim 1, wherein the gate is over the channel.

6. The transistor of claim 1, wherein the source and drain comprise sidewalls formed on an edge of at least the channel.

7. The transistor of claim 6, wherein the source and drain are further formed on a sidewall of the dielectric material.

8. A transistor, comprising:
- a channel formed of at least one carbon nanotube, wherein the ends of at least one nanotube are in contact with a source and with a drain of the transistor; and
- a gate for imparting an electric field to the channel, wherein the gate is asymmetric with respect to the source and the drain, and wherein the gate comprises a sidewall formed on an edge of a pad.

9. The transistor of claim 8, wherein the source and drain are self aligned with respect to the gate and to the pad.

10. The transistor of claim 8, wherein the channel comprises a plurality of carbon nanotubes.

11. The transistor of claim 8, wherein the at least one carbon nanotube comprises either a single-walled carbon nanotube or a multi-walled carbon nanotube.

12. The transistor of claim 8, wherein the gate is over the channel.

13. The transistor of claim 8, wherein the source and drain comprise sidewalls formed on an edge of at least the channel.

14. The transistor of claim 13, wherein the source and drain are further formed on a sidewall of the dielectric material.

15. A transistor, comprising:
- a first dielectric material;
- a channel formed of at least one carbon nanotube on the first dielectric material;
- a second dielectric material on the channel;
- two vertical edges, wherein each edges passes through the first dielectric material, the channel, and the second dielectric material;
- a source and a drain of the transistor, wherein the source and the drain each contact one of the edges, thereby contacting edges of the first dielectric material, the channel, and the second dielectric material; and
- a gate formed on the second dielectric material, wherein the gate is formed closer to the source than to the drain.

16. The transistor of claim 15, wherein the gate is formed on one edge of a pad.

17. The transistor of claim 15, wherein the source and drain are self aligned with respect to the gate.

18. The transistor of claim 15, wherein the gate is over the channel.

19. The transistor of claim 15, wherein the source and drain comprise sidewalls formed on the vertical edges.

20. A transistor, comprising:
- a channel region having edges, the channel region comprising a channel formed of at least one carbon nanotube and a dielectric layer on top of and under the channel;
- a source and drain formed on the edges of the channel region; and
- a gate formed as a sidewall on an edge of a pad for imparting an electric field to the channel, wherein the source and drain are self aligned with respect to the gate.

21. The transistor of claim 20, wherein the gate is asymmetric with respect to the source and drain.

22. The transistor of claim 20, wherein the source and drain comprise sidewalls formed on the edges of the channel region.

23. The transistor of claim 20, wherein the source and drain are formed with out the use of a patterning step.

24. The transistor of claim 20, wherein the gate is formed without the use of a patterning step.

* * * * *